(12) United States Patent
Zhao et al.

(10) Patent No.: US 11,493,888 B2
(45) Date of Patent: Nov. 8, 2022

(54) DELAY CIRCUIT WITH MULTIPLE DEPENDENCIES

(71) Applicant: Apple Inc., Cupertino, CA (US)

(72) Inventors: Bo Zhao, Cupertino, CA (US); Jaroslav Raszka, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/193,959

(22) Filed: Mar. 5, 2021

(65) Prior Publication Data

US 2022/0283549 A1 Sep. 8, 2022

(51) Int. Cl.
| | | |
|---|---|---|
| *H03K 5/00* | (2006.01) | |
| *G04F 10/00* | (2006.01) | |
| *G04F 10/06* | (2006.01) | |
| *H03K 5/14* | (2014.01) | |

(52) U.S. Cl.
CPC .......... *G04F 10/005* (2013.01); *G04F 10/06* (2013.01); *H03K 5/14* (2013.01); *H03K 2005/00013* (2013.01)

(58) Field of Classification Search
None
See application file for complete search history.

(56) References Cited

U.S. PATENT DOCUMENTS

| | | | | |
|---|---|---|---|---|
| 5,986,999 A | * | 11/1999 | Takahashi | G11B 7/08517 369/44.29 |
| 9,685,944 B1 | * | 6/2017 | Seshita | H03K 17/223 |
| 2008/0106954 A1 | * | 5/2008 | Sinha | G11C 7/04 365/194 |
| 2008/0122546 A1 | | 5/2008 | Shiramizu et al. | |
| 2011/0080200 A1 | * | 4/2011 | Zhou | H03K 3/64 327/172 |
| 2013/0257502 A1 | * | 10/2013 | Dong | H03K 5/133 327/288 |
| 2013/0307594 A1 | * | 11/2013 | Hatanaka | H03K 4/502 327/132 |
| 2017/0373673 A1 | | 12/2017 | Song et al. | |
| 2020/0090713 A1 | * | 3/2020 | Joo | G11C 11/4085 |

* cited by examiner

*Primary Examiner* — Cassandra F Cox
(74) *Attorney, Agent, or Firm* — Kowert, Hood, Munyon, Rankin & Goetzel, P.C.; Erik A. Heter; Dean M. Munyon

(57) ABSTRACT

A delay circuit with multiple dependencies on various environmental parameters is disclosed. The delay circuit is configured to receive an input signal. The delay circuit includes a first circuit configured to generate a first amount of delay, wherein the first amount of delay has a direct relationship to a first environmental parameter. The delay circuit also includes a second circuit configured to generate a second amount of delay such that the second amount of delay has an inverse relationship to a second environmental parameter. The delay circuit is configured to generate a delayed output signal based on the first and second amounts of delay generated by the first and second circuits.

20 Claims, 9 Drawing Sheets

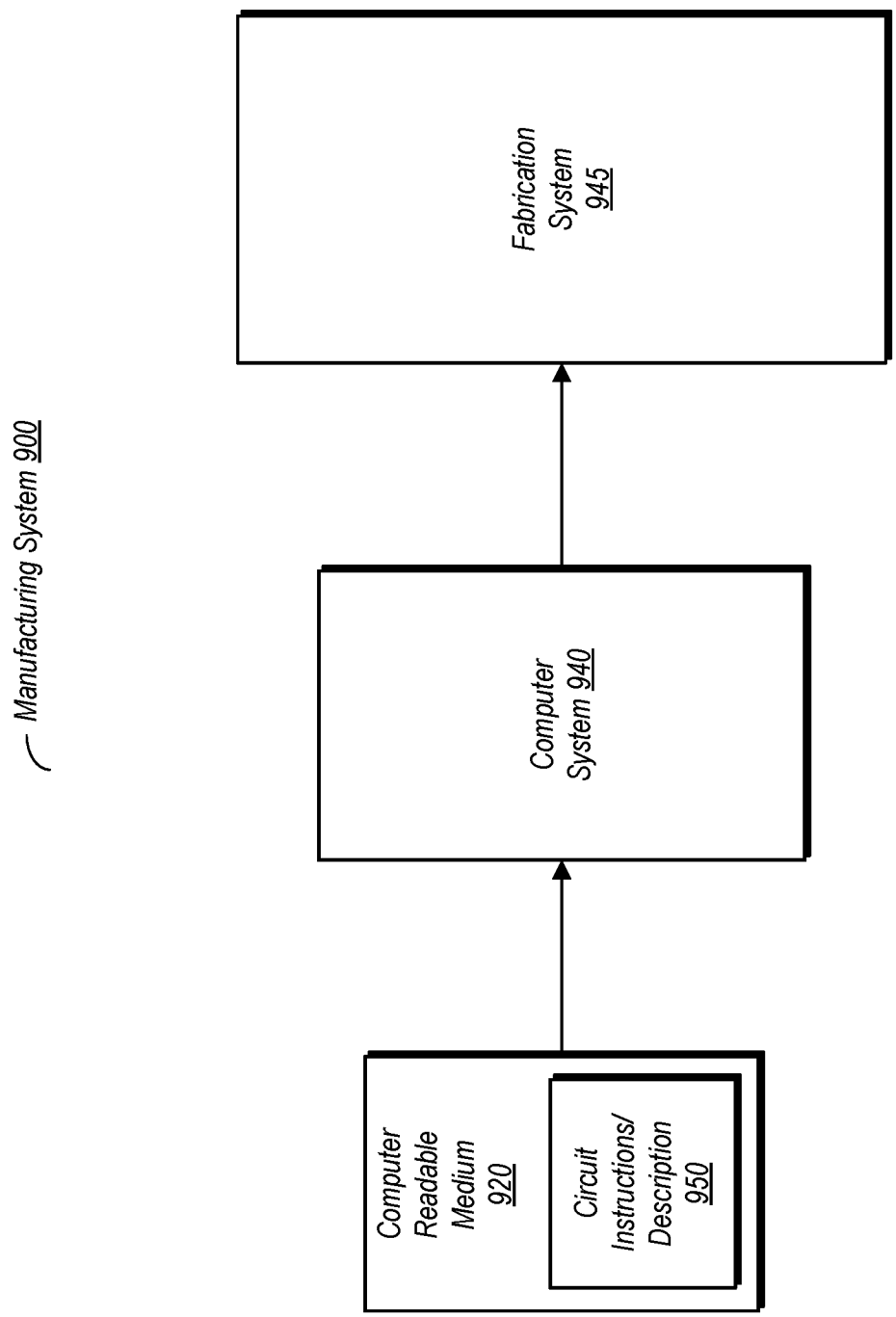

DELAY CIRCUIT WITH MULTIPLE DEPENDENCIES

BACKGROUND

Technical Field

This disclosure is directed to electronic circuits, and more particularly, to circuits for delaying the propagation of signals.

Description of the Related Art

Delay circuits are used in a wide variety of electronic systems. Generally speaking, a delay circuit may be used when it is desirable to increase the amount of time it takes for a signal to propagate from one point to another. Applications in which delay circuits are used may include, e.g., circuits used to control the timing of a particular event. Furthermore, a wide variety of circuit topologies may be used to implement delay circuits.

SUMMARY

A delay circuit with multiple dependencies on various environmental parameters is disclosed. In one embodiment, a delay circuit is configured to receive an input signal. The delay circuit includes a first circuit configured to generate a first amount of delay, wherein the first amount of delay has a direct relationship to a first environmental parameter. The delay circuit also includes a second circuit configured to generate a second amount of delay such that the second amount of delay has an inverse relationship to a second environmental parameter. The delay circuit is configured to generate a delayed output signal based on the first and second amounts of delay generated by the first and second circuits.

In one embodiment, a delay circuit according to the present disclosure may be implemented in one or more stages. At least one stage may include a delay circuit in which a delay provided by a first circuit element has an inverse relationship with a particular environmental parameter, while delay provided by the second circuit element has a direct relationship with the same environmental parameter.

BRIEF DESCRIPTION OF THE DRAWINGS

The following detailed description makes reference to the accompanying drawings, which are now briefly described.

FIG. 9 is a block diagram illustrating one embodiment of a computer system, a computer readable medium, and a fabrication system.

DETAILED DESCRIPTION OF EMBODIMENTS

Figure 1:
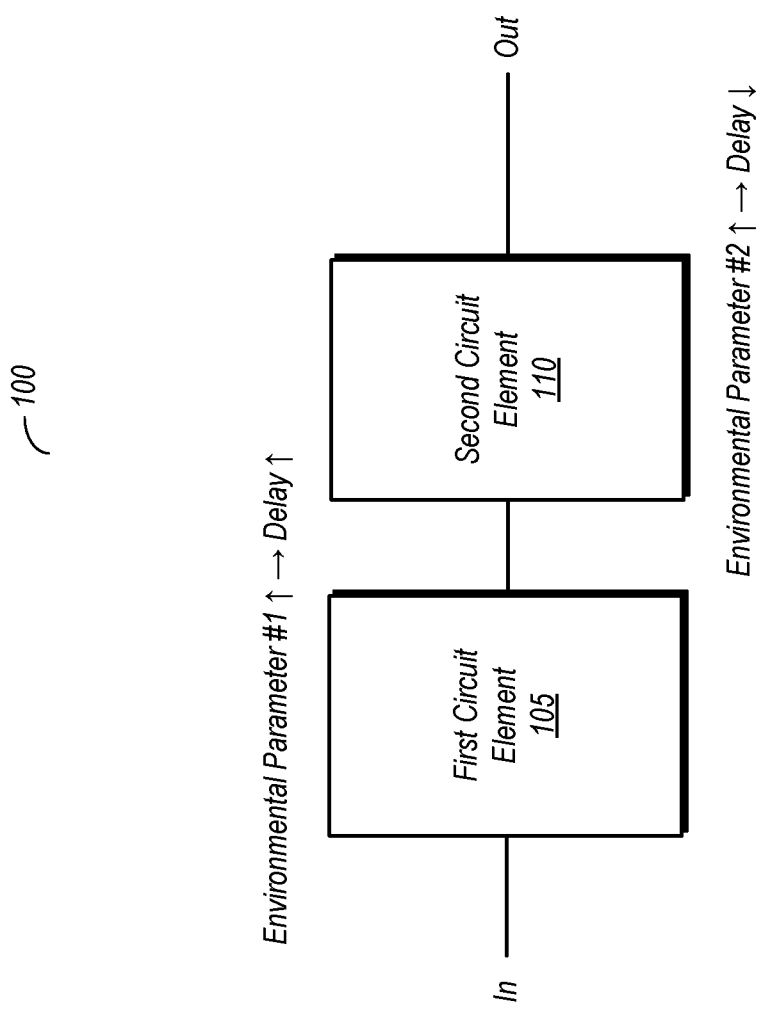
FIG. 1 is a block diagram of one embodiment of a delay circuit.

The present disclosure is directed to a delay circuit having multiple dependencies based on various environmental parameters. In generic CMOS (complementary metal oxide semiconductor) devices, the amount of delay tends to fall with an increase in the supply voltage. Furthermore, delay in CMOS devices varies with temperature. Due to these dependencies, it is difficult to design a delay circuit having CMOS devices with a substantially constant or controllable delay over a wide range of operating conditions. Using the insight of known dependencies of CMOS devices, various embodiments of a delay circuit may be implemented in accordance with this disclosure.

In various embodiments, a delay circuit as implemented herein may include at least one stage that has a first delay dependency that has a direct relationship to a first environmental property (e.g., increases as a value of the first environmental parameter increases) and a second dependency that has an inverse relationship to a second environmental property (e.g., decreases as a value of second environmental parameter increases). A circuit having a first circuit element with a delay having an inverse relationship to a particular environmental parameter and a second circuit element with the delay having a direct relationship to the same environmental parameter is also contemplated. A multi-stage delay circuit that may include various types of circuit elements implementing the direct and inverse relationships discussed herein is also contemplated.

In some embodiments, a resistive-capacitive (RC) circuit may be implemented, with the RC circuit configured to increase an amount of delay in response to an increase in a supply voltage (e.g., delay and voltage have a direct relationship to one another). In some embodiments, the RC circuit may also be implemented such that it has an inverse relationship to temperature (e.g., delay increases as temperature decreases, and vice versa). In various embodiments, additional circuits may be implemented that have a direct relationship between temperature and the delay applied to a signal.

Some embodiments of the delay circuit discussed herein may be used in various applications in which a substantially constant delay is required over a particular range of environmental parameters. Other circuit embodiments disclosed herein may also be used to generate an amount of delay with a desired sensitivity/variation over a particular range (or rangers) of environmental parameters.

Details of various embodiments of a delay circuit in accordance with this disclosure are now discussed below. This discussion begins with block diagrams of various embodiments of a delay circuit. Thereafter, a schematic diagram of one particular embodiment is discussed. This is followed by a discussion of graphic representations of the operation of various circuit elements for a particular embodiment of a delay circuit. A time-to-digital converter is also discussed as one example of an application in which various embodiments of a delay circuit may be utilized. A flow diagram illustrating a method for operating one embodiment of a delay circuit is then discussed, followed by a discussion of an example system, and a computer system with a computer readable medium storing instructions corresponding to an embodiment of the delay circuit.

Delay Circuits with Dependencies on Multiple Environmental Parameters:

FIG. 1 is a block diagram of one embodiment of a delay circuit. In the embodiment shown, delay circuit 100 includes a first circuit element 105 and a second circuit element 110 coupled to one another in a series configuration. The first circuit element 105 is configured to receive an input signal, "In." The second circuit element 110 is configured to provide an output signal, "Out," that is a delayed version of the input signal. First circuit element 105 is configured to generate a first amount of delay, while second circuit element 110 is configured to generate a second amount of delay. The total delay provided by delay circuit 100 is thus the sum of the first delay and the second delay in the embodiment shown.

In the embodiment shown, the delay applied to the input signal is dependent on various environmental parameters. Examples of these parameters include voltage (e.g., supply voltage) and temperature of the circuit. First circuit element 105 in this particular embodiment has a direct relationship to a first parameter, Environmental Parameter #1. More particularly, as a value of Environmental Parameter #1 increases, the delay in first circuit element 105 correspondingly increases. Similarly, a decrease in Environmental Parameter #1 leads to a corresponding decrease in the delay.

In second circuit element 110, an inverse relationship is present between Environmental Parameter #2 and the delay. Thus, when the value of Environmental Parameter #2 increases, the delay generated by second circuit element 110 falls. When the value of Environmental Parameter #2 decreases, the delay increases for a signal propagating through second circuit element 110.

It is noted that the order in which the first and second circuit elements are shown here is not intended to be limiting. It is further noted that delay circuits can be constructed using various combinations of the circuit elements discussed herein, including staged embodiments as will be discussed further below. It is further noted that delay circuits may be implemented using circuit elements in which the delay produced is dependent on multiple environmental parameters.

Figure 2:
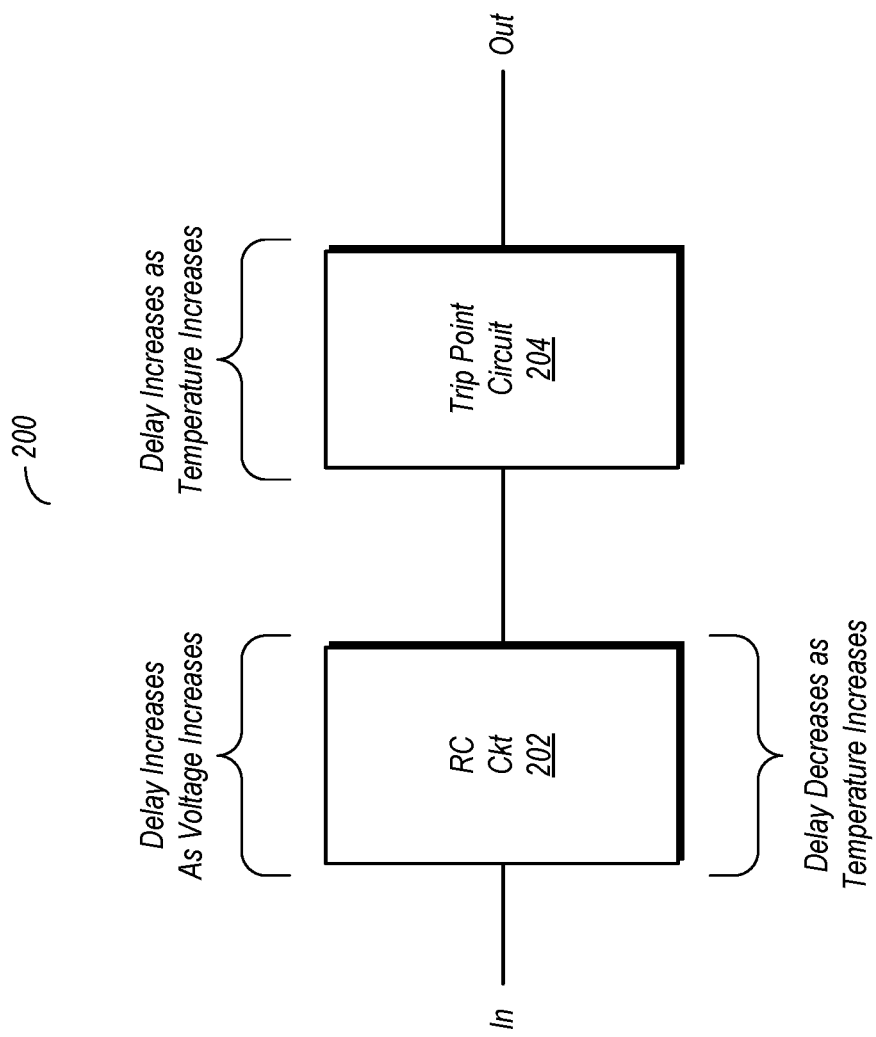
FIG. 2 is a block diagram of another embodiment of a delay circuit.

FIG. 2 is a block diagram of another embodiment of a delay circuit. In the embodiment shown, delay circuit 200 includes a resistive-capacitive (RC) circuit 202 and a trip point circuit 204. Details of various embodiments of these circuits are discussed below. For this particular embodiment, RC circuit 202 is coupled in series with trip point circuit 204. Delay circuit 200 in this embodiment is arranged to receive an input on the 'In' node, at RC circuit 202, and generate the output signal on the 'Out' node, from trip point circuit 204.

RC circuit 202 in this embodiment has two different delay dependencies. A first delay dependency is based on the environmental parameter of voltage. This relationship is a direct relationship between voltage and delay such that delay provided by RC circuit 202 increases as the voltage (e.g., a supply voltage) increases. Similarly, as the voltage decreases, the delay provided by RC circuit 202 decreases.

A second delay dependency in RC circuit 202 is based on the environmental parameter temperature. In this embodiment, the relationship between temperature and delay is an inverse relationship. Thus, when the temperature rises, the delay through RC circuit 202 falls in this particular embodiment, and vice versa.

It is noted here that the term 'direct' is not intended to indicate that the relationship is necessarily proportional (although proportional does fall within the definition of 'direct' per this disclosure). Instead, the term 'direct' as indicated here broadly means that the direction of change is generally the same between the delay and a particular environmental parameter (such as the voltage mentioned here), even if the rates of change are not necessarily the same. Furthermore, the term 'inverse' is not intended to indicate that a particular relationship between delay and an environmental parameter is necessarily inversely proportional, but rather that the quantities generally change in opposite directions (e.g., one increases while the other decreases) with respect to one another. Thus, while the term 'inverse' may include a relationship that is inversely proportional, the term is not limited to such a relationship.

Trip point circuit 204 in the embodiment shown, when used in conjunction with RC circuit 202, causes a direct relationship between delay and temperature in delay circuit 200. Thus, as the temperature rises, the delay also rises, while the delay falls as temperature falls due to the effect of trip point circuit 204 being coupled in series with RC circuit 202. As is discussed further below, the direct relationship between delay and temperature realized by coupling trip point circuit 204 to the output of RC circuit 202 is due to the temperature-related changes in a threshold voltage for this particular embodiment. Given that RC circuit 202 of this embodiment has an inverse relationship between temperature and delay, it thus follows that delay circuit 200 has two different delay dependencies with respect to temperature. In various embodiments, the components used to implement RC circuit 202 and trip point circuit 204 may be selected such that the delay-temperature relationship of one of these circuits is dominant with respect to the other. Furthermore, components used to implement these circuits may also be implemented to be offsetting with respect to one another, with the temperature-delay relationship of one of these two circuits substantially canceling out the corresponding relationship of the other.

Figure 3:
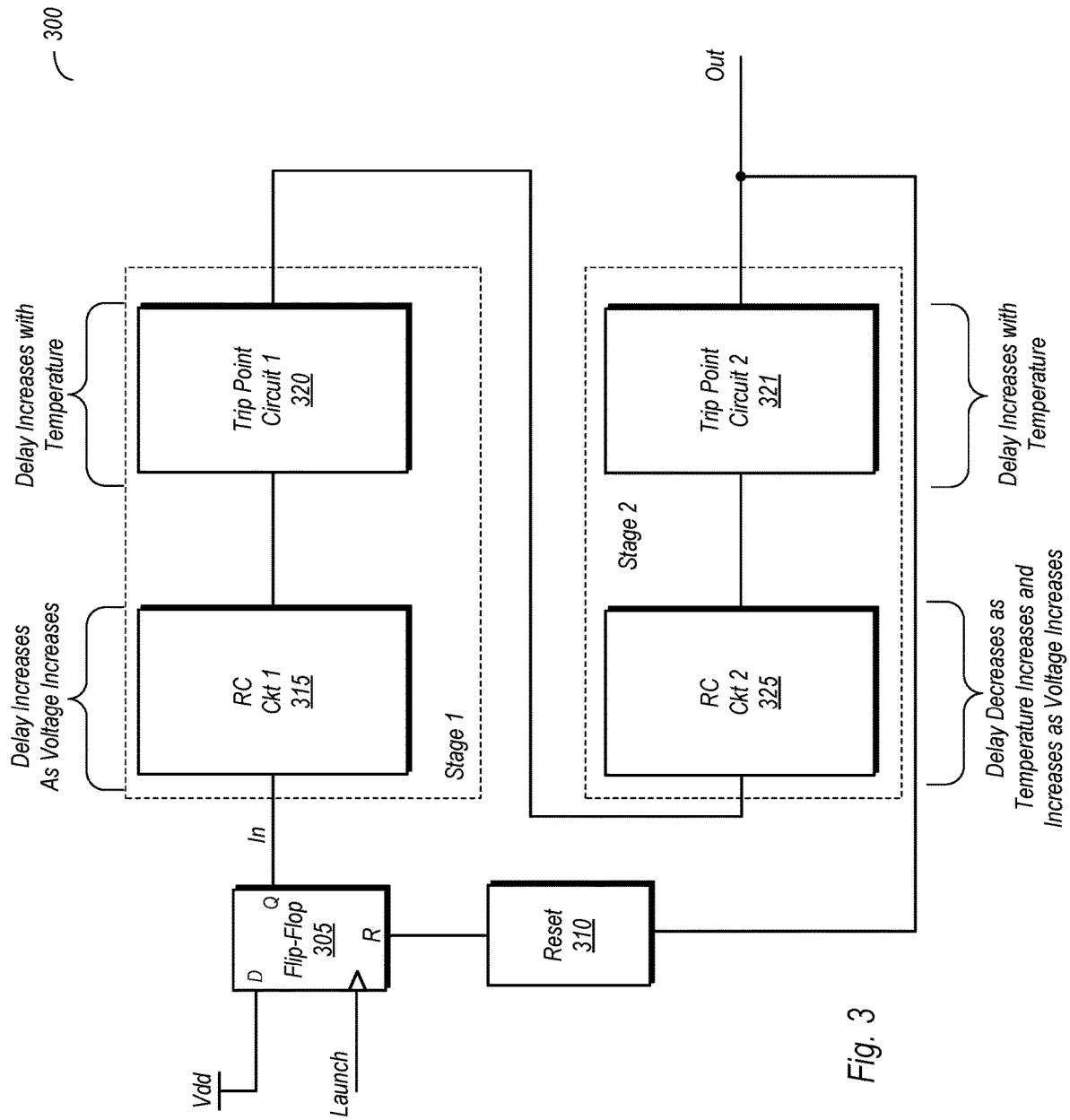
FIG. 3 is a block diagram of another embodiment of a delay circuit.

FIG. 3 is a block diagram of another embodiment of a delay circuit. In this embodiment, delay circuit 200 is implemented in two separate stages. Each stage in the embodiment shown includes an RC circuit and a trip point circuit. However, the RC circuits of Stages 1 and 2 are different from one another. Delay circuit 200 in this embodiment also includes a flip-flop 305 configured to cause a signal to be input into Stage 1 of the circuit, and a reset circuit configured to cause a resetting of the circuit. It is noted however that these elements are optional, and are included herein for the sake of completeness with respect to the use of delay circuit 300 in certain applications. As will be discussed with reference to FIG. 6, delay circuit 300 may be used in a time-to-digital converter (TDC). However, the two-stage embodiment here is not limited to such applications.

In Stage 1 of the present embodiment, RC circuit 315 has a direct relationship between voltage and delay, while trip point circuit 320, working in conjunction with RC circuit 315 as shown here, has a direct relationship between temperature and delay. In contrast to the RC circuit discussed above with reference to FIG. 2, RC circuit 315 as shown here does not necessarily have an inverse relationship with temperature. Thus, although there may be some inherent delay dependency on temperature in RC circuit 315, the circuit itself is not designed to have an inverse relationship between temperature and delay. Instead, RC circuit 315 in this embodiment is designed such that the primary environmental factor affecting delay is voltage. Furthermore, the overall design of Stage 1 of delay circuit 300 is such that the primary delay-temperature dependency is realized by trip point circuit 320. Thus, any delay-temperature relationship that may be inherent to RC circuit 315 may be relatively small, if not negligible altogether, with respect to the delay-temperature relationship realized by the use of trip point circuit 320 in as shown in Stage 1.

Stage 2 of delay circuit 200 in the embodiment shown includes an RC circuit 325 that may operate in a similar manner to that of RC circuit 202 shown in FIG. 2. Thus, RC circuit 325 includes a direct relationship between delay and voltage, and an inverse relationship between delay and temperature. Meanwhile, trip point circuit 321 of Stage 2 may be implemented in a similar manner to trip point circuit 320 of Stage 1, with a direct relationship between delay and temperature being realized in that instance. As noted above, the components of these circuits may be selected to such that the delay-temperature relationship is dominant in one or the other of RC circuit 325 and trip point circuit 321. In some embodiments, the dominant delay-temperature relationship in a circuit arranged such as Stage 2 may be realized by RC circuit 325, while in other embodiment, the dominant relationship between these two quantities may be realized in trip-point circuit 321. Furthermore, embodiments are possible and contemplated in which the respective delay-temperature relationships of RC circuit 325 and trip point circuit 321 are substantially offsetting such that the delay through Stage 2 (or, e.g., a similarly arranged single-stage embodiment) is largely independent of temperature.

Flip-flop 305 in this particular embodiment is a D-type flip-flop having the D input hardwired to a supply voltage node Vdd. The clock input of this implementation is coupled to receive a Launch signal. When the launch signal is received, the output of flip-flop 305, Q, is provided as the input signal, In, to RC circuit 315 of Stage 1. The signal propagates through the circuit elements of both stages, to the output node to become an output signal that is a delayed version of the input signal. In some embodiments, the output signal may be fed back directly to a reset input R of flip-flop 305. In this particular embodiment, the output signal is provided to reset circuit 310, which may provide some delay shaping and holding functions before an input is provided to the reset input of flip-flop 305. Such functions may, for example, cause the state of the output signal to be held for a longer time after the signal has propagated through delay circuit 300. Irrespectively, when the Reset input of flip-flop 305 is toggled, the state of its output signal is changed and circuits within the stages are reset to their respective states prior to changing the state of the signal In. A schematic diagram of one embodiment of such a circuit is now discussed in further detail.

Example Delay Circuit Schematic

Figure 4:
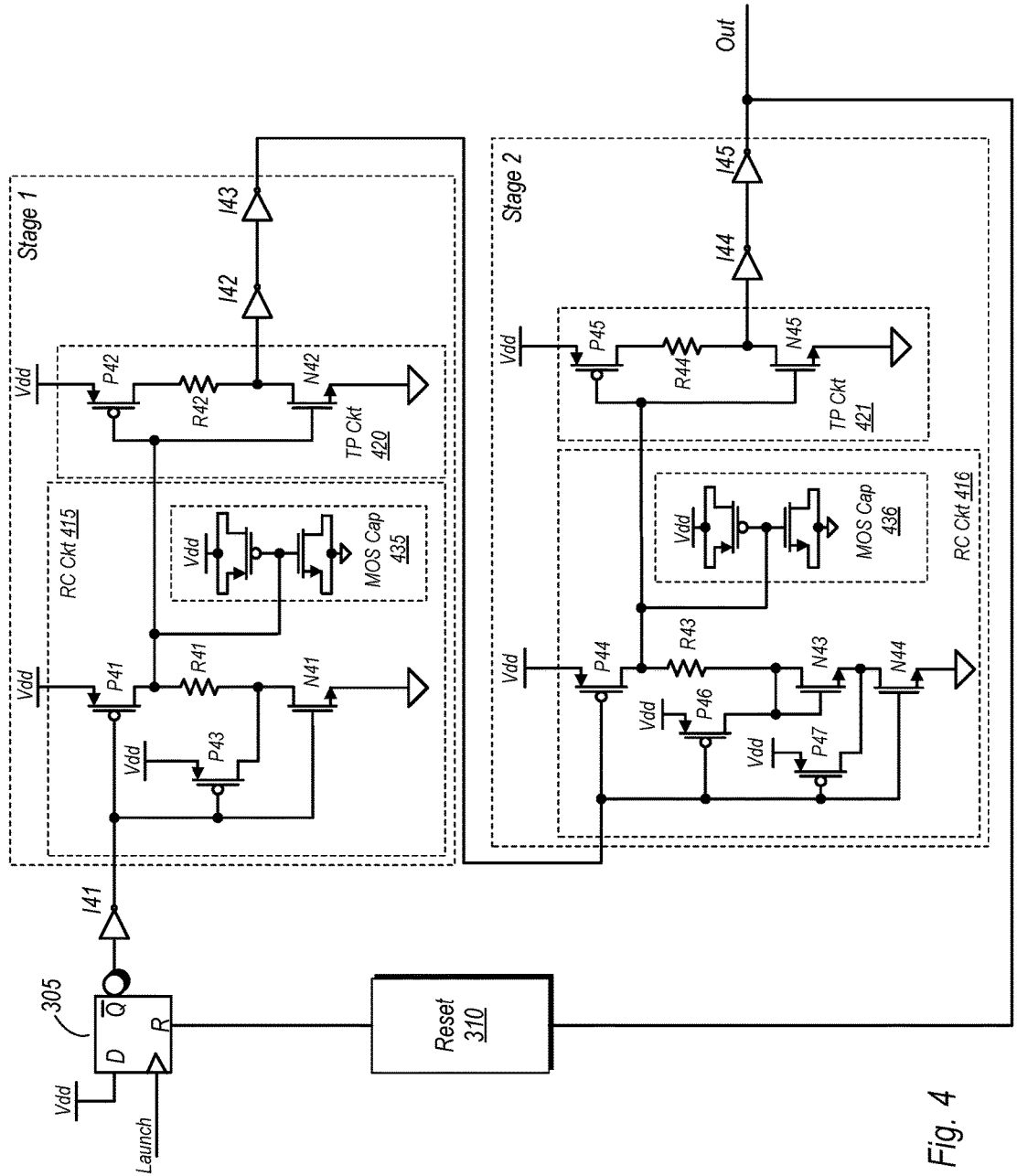
FIG. 4 is a schematic diagram of one embodiment of a delay circuit.

FIG. 4 is a schematic diagram of one embodiment of a delay circuit. In the embodiment shown, delay circuit 400 is functionally similar to delay circuit 300 of FIG. 3. Accordingly, delay circuit 400 is a two-stage embodiment, with each stage including an RC circuit and a trip point circuit.

A signal to which delay is to be applied in the illustrated embodiment is input into the delay path in response to receiving the Launch signal. If flip-flop 305 is an edge-triggered flip-flop, the rising edge of the launch signal will cause a logic 1 to be received through the D input (due to it being hardwired to Vdd). Accordingly, Q is output as a logic low from flip-flop 305 and inverted, by inverter I41, into a logic high.

RC circuit 415 in the embodiment shown includes a PMOS transistors P41 and P43, a resistor R41, an NMOS transistor N41, and a capacitor implemented here as MOS (metal oxide semiconductor) capacitor 435, which is implemented here using capacitor-coupled PMOS and NMOS devices. However, a capacitor may be implemented using a discrete capacitor or using any other technique suitable for implementing a capacitor on an integrated circuit. It is noted that transistor P43 in this embodiment is provided for the purpose of performing a reset of RC circuit 415.

Logically, RC circuit 415 functions as an inverter having a resistor in its pulldown stack. As shown in FIG. 4, P41 implements the pull-up function of the inverter, while N41 implements the pull-down function, with R41 coupled between N41 and an output of the inverter circuit formed by N41 and P41. When P41 is active (due to a logic low output from inverter I41), the capacitors of MOS capacitor 435 are charged. When a logic high is output from inverter I41, transistor N41 is activated. The capacitance of MOS capacitor 435 and the resistance of R41 form an RC discharge path. Accordingly, the capacitors are discharged through this path. The time to discharge is dependent on the RC time constant of the path, which is a product of the resistance R of resistor R41 and the capacitance C of MOS capacitor 435. The other factor is the supply voltage Vdd, as the capacitor will store more charge at higher values of the supply voltage when P41 is active. Accordingly, the amount of time to discharge the node coupling RC circuit 415 to trip point circuit 420 increases as the supply voltage increases, assuming a constant temperature.

Trip point circuit 420 in the embodiment shown is also a logical inverter. In this case, however, an inverter is placed in the pull-up path, thereby weakening the pull-up strength of the inverter. Trip point circuit 420 as shown here includes PMOS transistor P42, a resistor R42 in the pull-up path, and an NMOS transistor that implements the pull-down path. Prior to the discharging of the RC path in RC circuit 415, transistor N42 may be active, while P42 is inactive. In PMOS transistors, there is an inherent relationship between threshold voltage and temperature. More particularly, as the temperature rises, the threshold voltage of a PMOS device falls. The trip point of the inverter comprising P42, R42, and N42 is a combined effect of the pull-up and pull-down (through P42 and N42, respectively). The pull-down strength of N42 is greater than the pull-up strength of P42, the latter being sized smaller than the former in the illustrated embodiment. The pull-up is also weakened by the presence of R42, which also has a temperature dependency. On the pull-down side, an increase in temperature results in a decrease of the threshold voltage for N42, thereby strengthening the pull-down. For the pull-up side, an increase in the temperature results in a decrease in the threshold voltage of P42, although the resistance of R42 increases with temperature. Depending on the interaction between P42 and R42, the strength of the pull-up may be slightly weaker or slightly stronger. Overall, however, the pull-down effect is stronger, and thus the trip point of trip point circuit 420 is thus lower. Therefore, trip-point circuit 420 implements a circuit in which the delay increases as temperature increases, and falls as temperature falls when used in conjunction with RC circuit 415 as shown in FIG. 4. Overall, Stage 1 in the illustrated embodiment implements a circuit in which the delay applied to a propagating signal increases as voltage increases (due to the effect of RC circuit 415) and increases as temperature increases (due to the effect of trip-point circuit 420).

The output of Stage 1 is buffered by two series-coupled inverters, I42 and I43, in the embodiment shown. A signal output from I43 is input into Stage 2, which includes an RC circuit 416. In this embodiment, RC circuit 416 includes similar components as RC circuit 415 of Stage 1, but also includes a diode-coupled transistor N43 in the pulldown path, between resistor R43 and NMOS transistor N44. This causes some difference in operation of RC circuit 416 with respect to RC circuit 415. In particular, the presence of the diode-coupled transistor N43 changes the discharge floor of the RC circuit implemented by MOS capacitor 436 (which is charged when P44 is active) and resistor R43. When the temperature rises, the threshold voltage to turn on N43 falls. This has the effect of creating a stronger pulldown effect in the pulldown path that includes R43, N43, and N44. The stronger pulldown effectively results in a lower resistance in the RC discharge path as temperature increases. Since the amount of time to discharge the RC discharge path is dependent on the product of R times C, reducing the resistance in the discharge path thus results in faster discharge times at a particular voltage. Accordingly, assuming a constant supply voltage, the delay through RC circuit 416 decreases as temperature increases. Conversely, as the temperature decreases (again assuming a constant supply voltage), the threshold voltage of N43 increases, reducing the pulldown strength and increasing the resistance in the RC discharge path, thereby increasing the discharge time. Accordingly, RC circuit 416 has an inverse relationship between delay and temperature due to the reduced discharge times that accompany higher temperatures. With respect to the relationship between delay and supply voltage, RC circuit 416 operates similarly to RC circuit 415 of Stage 1 when the temperature remains constant.

Trip point circuit 421 in the embodiment shown is implemented using the same topology as trip point circuit 420. More particularly, trip point circuit 421 includes a pull-up stack implemented using P45 and R44, and a pulldown transistor N45. Accordingly, the trip point in trip point circuit 421 may vary in a similar manner as that of trip point circuit 420, as described above.

It is noted that while the respective topologies of trip point circuit 420 and 421 may be the same, these circuits may implemented with different component values and may thus have different delay characteristics with respect to one another. For example, parameters such that may vary between the two implementations shown here include resistance of the respective resistors, gate widths, gate lengths, and so on. Similar parameters may be varied with regard to the components of RC circuits 415 and 416. Generally speaking, component values of the various devices used to implement embodiments of the delay circuit disclosed herein may be selected to tune the circuit to achieve a desired delay and/or a desired sensitivity to the environmental parameters upon which the delay depends.

The output from trip point circuit 421 is buffered by inverters I44 and I45, the latter of which provides the output signal from delay circuit 400. The feedback signal to reset circuit 310 is also provided from this node. Upon the reset signal toggling the reset input, the $\overline{Q}$ output from flip-flop 305 transitions high and causes I41 to output a logic low. The logic low turns on both P41 and P43. When P43 is turned on, the voltage on the drain terminal of N41 is pulled high, as well as one terminal of R41. The activation of P41 also pulls the other terminal of R41 high, and thus the voltage across this resistor is effectively zero when in the reset state. Meanwhile, the capacitor implemented by MOS capacitor 435 is charged at this time.

During the reset, a similar operation occurs when a logic low propagates from the output of I43. This results in activation of P44, P46, and P47. The activation of P47 pulls the drain terminal of N44 to a logic high. The activation of P46 pulls both the drain and gate terminals of N43 high. In addition to the charging of MOS capacitor 436, the activation of P44 results in the activation of N45, and eventually a logic low on the output of I45. At this point, delay circuit 400 in the embodiment shown is fully in a reset state.

Figure 5:
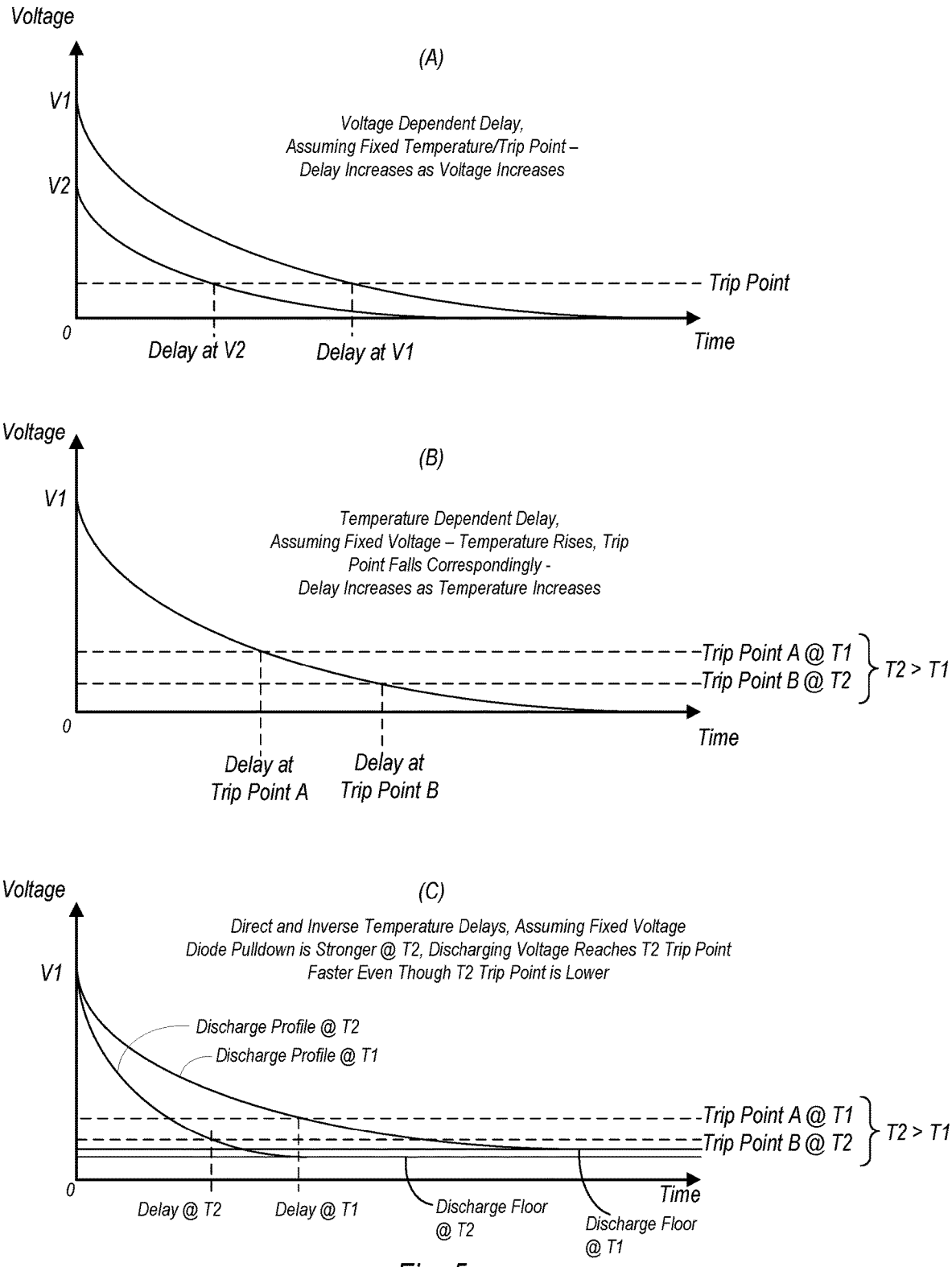
FIG. 5 graphically illustrates operation of one embodiment of a delay circuit.

Graphic Illustration of Circuit Operation:

FIG. 5 is a series of graphs that illustrate operation of one embodiment of a delay circuit. The graphs each illustrate the combined operation of an RC circuit and a trip point circuit, such as those discussed above in reference to FIG. 4. In (A), operation of a circuit such as RC circuit 415 of FIG. 4 at a constant temperature is illustrated. In (B) the operation of a circuit such as trip point circuit 420 is illustrated in relation to an embodiment of RC circuit 415 when the voltage is constant. In (C), the operation of a circuit such as RC circuit 416 of FIG. 4 is illustrated to show the effect of temperature in Stage 2 of delay circuit 400.

In (A), the discharge profile for a circuit configured as RC circuit 415 of FIG. 4 is shown for two different voltages at a constant temperature. At a constant temperature, a given trip point is set by the trip point circuit, with the trip point depending on the temperature of the circuit. As shown in (A), for a constant temperature (and thus a constant trip point), the discharge from supply voltage V1 has a longer discharge time before reaching the trip point. From supply voltage V2, which is less than V1, the trip point is reached faster. According, the delay at the supply voltage V1 is greater than at V2 for a constant temperature, and thus a constant trip point.

In (B), the supply voltage is held constant, but the trip points change based on a corresponding change in temperature. As shown, Trip point A corresponds to a temperature T1, while trip point B corresponds to a temperature T2, where T2>T1. As further shown, Trip Point A has a higher value than Trip Point B, since the trip point falls as temperature rises in the given circuit configuration. Accordingly, as the RC circuit discharges from voltage V1, it reaches Trip Point A earlier than it reaches Trip Point B. Accordingly, the delay is less at Trip Point A than at Trip Point B. Furthermore, since Trip Point B corresponds to a higher temperature with respect to Trip Point A, (B) illustrates that the delay through the trip point circuit increases with temperature.

In (C), the operation of a stage with two different temperature dependencies is illustrated. As noted above with reference to FIG. 4, the delay through RC circuit 416 has an inverse relationship with temperature, while the delay through trip point circuit 421 has a direct relationship to temperature. As with (B), this example includes Trip Point (A) corresponding to a temperature T1 and a Trip Point B corresponding to a temperature T2, with T2>T1. The inverse relationship to temperature is realized in RC circuit 416 due to the diode (or diode-coupled transistor) in the pulldown stack. As the temperature increases, the threshold voltage of the diode-coupled transistor decreases. This causes the discharge floor (which is greater than ground potential) to fall correspondingly. Further, as shown, the discharge floor varies with temperature, being lower at T2 than at T1, with both discharge floors being less than the trip points associated with these temperatures. As the discharge floor falls, the pulldown stack exhibits a stronger pulldown and thus sinks more current. Effectively, the resistance is decreasing in RC circuit 416 as the temperature falls. Since the duration of the discharge is based on the product of the resistance and the capacitance, this duration also falls as temperature rises. Therefore, as shown in (C), from a beginning voltage of V1, the discharge profile at T2 reaches Trip Point B faster than the discharge profile at T1 reaches Trip Point A. This occurs despite the fact that Trip Point A is at a higher voltage than Trip Point B. Therefore, in this particular example, the delay at T2 is less than at T1 even though the temperature of the former is higher than the latter.

It is noted that (C) provides an example in which a circuit is tuned such that the RC circuit with a diode has a greater effect on the temperature response than the correspondingly coupled trip point circuit. However, it is possible and contemplated that a similar circuit could be implemented wherein the trip point circuit has a greater effect on temperature than the RC circuit with a diode. It is further contemplated that these circuits may be implemented in a manner in which the respective temperature responses effectively cancel out one another in order to achieve a delay circuit that is able to maintain a substantially constant delay over a range of temperatures. The tuning of a circuit to achieve the desired delay may be achieved by selecting circuit components based on various physical and electrical characteristics thereof. For example, dimensions of various components may be varied in accordance with their response characteristics in order to achieve a desired relationship between delay and a particular environmental parameter.

Figure 6:
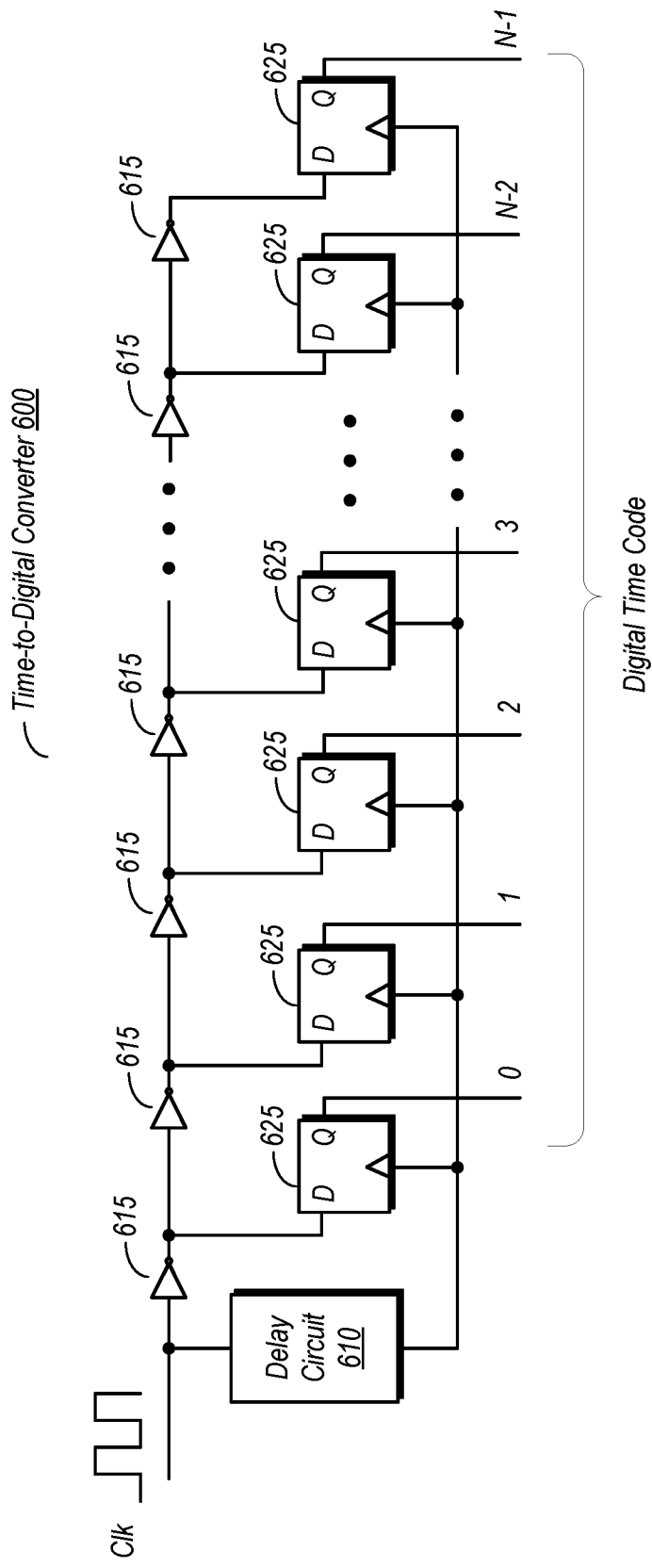
FIG. 6 is a block diagram of one embodiment of a time-to-digital converter (TDC) utilizing a delay circuit.

Time-to-Digital Converter Using Delay Circuit:

FIG. 6 is a diagram of one embodiment of a time-to-digital converter (TDC) circuit. TDC circuit 600 as shown here represents one possible application of a delay circuit in accordance with this disclosure. As shown here, TDC 600 includes a number of serially coupled inverters 615 each having an output coupled to a 'D' input of a D-type flip-flop 625. A clock signal is input to propagate through the inverters. The clock signal is also received by delay circuit 610, which may be any of the embodiments discussed above or otherwise falling within the scope of this disclosure. A delayed version of the clock signal is output from delay circuit 610 and provided to respective clock inputs of the flip-flops 625. When a rising edge is received by the clock inputs of the flip-flops 625, a current value on their respective D inputs is captured. Thus, TDC 600 in the illustrated embodiment generates a digital value based on an amount of elapsed time. More particularly, TDC 600 is configured to generate the digital value in response to receiving the output signal from the delay circuit. The captured values may be output from the Q outputs of the flip-flops. The aggregate of the outputs forms a digital code having bits 0 to N−1. Given that the rising edge received by the flip-flops 625 is delayed relative to the rising edge of the clock signal that is input into the first inverter 615 of the chain of inverters, the digital code is thus representative of an amount of time the signal has propagated through the chain.

The example of TDC 600 as shown here may be used in various applications. For example, TDC 600 may be used to detect a voltage droop. Since the delay provided by delay circuit 610 includes a dependency on voltage, and since the code indicates the distance through the chain in inverters 625 that a rising edge has propagated in a current cycle, a code indicating a shorter propagation time may be indicative of a voltage droop, as a rising edge will propagate through fewer inverters before a delayed rising edge reaches the flip-flops 625. More generally, TDC 600 may be used in a variety of applications in which it is desirable to know the propagation time of a signal.

It is noted that the TDC 600 is an example use case for the delay circuit disclosed herein. Other applications of the delay circuit of the present disclosure are possible and contemplated. Generally speaking, various embodiments of a delay circuit as discussed above and falling within the scope of this disclosure may be used in application where delaying a signal is desirable, such as controlling the activation of another circuit, controlling the timing of signals transferred across clock boundaries, and so on. It is further noted that while the embodiments discussed herein use certain logic and voltage levels, the disclosure is not intended to limit implementations to these particular levels.

Figure 7:
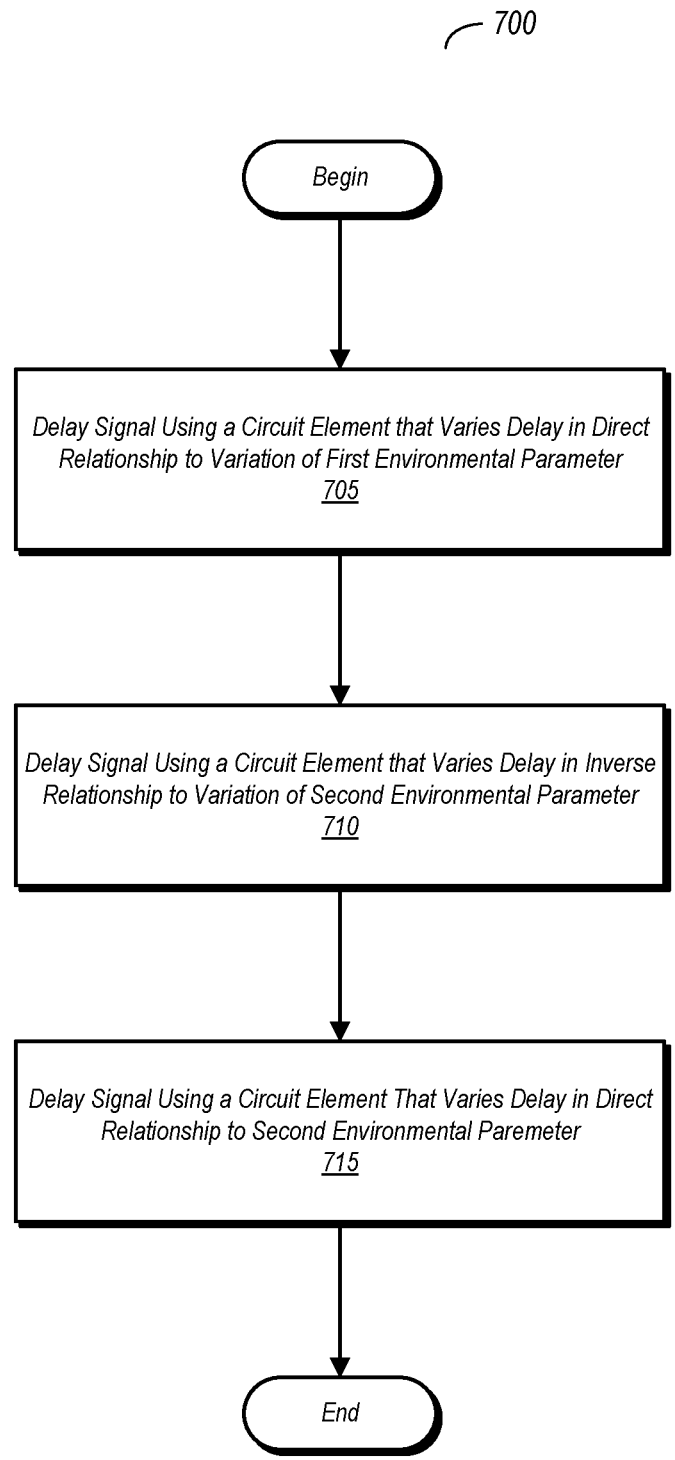
FIG. 7 is a flow diagram illustrating one embodiment of a method for operating a delay circuit.

Method for Operating an Embodiment of a Delay Circuit:

FIG. 7 is a flow diagram illustrating one embodiment of a method for operating a delay circuit. Method 700 may be performed using various embodiments of a delay circuit in accordance with this disclosure. Furthermore, an embodiment of a delay circuit capable of carrying out Method 700 but not explicitly discussed herein may nevertheless be considered to fall within the scope of this disclosure.

Method 700 includes delaying a signal using a circuit element that varies the delay in a direct relationship to a first environmental parameter (block 705). The method further includes delaying the signal using a circuit element that varies the delay in an inverse relationship in variation to a second environmental parameter (block 710). The method also includes varying the delay using a circuit element that varies the delay in a direct relationship to the second environmental parameter. It is noted that the delay in some circuits may have dependencies on multiple environmental parameters. For example, a circuit element may have a first delay dependency in direct relationship to the first environmental parameter, and a second delay dependency having an inverse relationship to the second environmental parameter.

In various embodiments, the environmental parameters may include voltage (e.g., a supply voltage provided to the delay circuit) and temperature (e.g., the temperature at which the delay circuit is currently operating). Furthermore, the various circuit elements may be separately adjustable to achieve an amount of desired amount of delay for the delay circuit.

In one embodiment, a circuit element may include a resistive-capacitive (RC) circuit. A second circuit coupled to the RC circuit may be configured to switch from a first state to a second state responsive to the RC circuit discharging down to a corresponding threshold voltage. The second circuit is configured to increase an amount of delay by reducing the corresponding threshold voltage in response to an increase in temperature.

In an embodiment including an RC circuit, the RC circuit is configured to increase the amount of delay in response to a decrease in temperature, and increase the amount of delay in response to a decrease in temperature. Embodiments in which the delay provided by the RC circuit does not vary significantly with temperature are also possible and contemplated. The RC circuit in various embodiments includes a pull-up transistor having a respective gate terminal coupled to an input node and a drain terminal coupled to an output node and a pull-down transistor having a respective gate terminal coupled to the input node and a source terminal coupled to a reference node. The RC circuit also includes a resistor coupled between the output node and the pull-down transistor and at least one capacitor coupled to the output node. In embodiments wherein the RC circuit is configured to increase the amount of delay in response to a decrease in temperature, the RC circuit includes a diode coupled between the resistor and the pull-down transistor.

The second circuit in various embodiments may be referred to as a trip point circuit. The trip point circuit in various embodiments includes a pull-down transistor having a respective gate terminal coupled to the first RC circuit and a drain terminal coupled to an output node, and a pull-up transistor having a respective gate terminal coupled to the first RC circuit. The trip point circuit also includes a resistor coupled between the output node and a drain terminal of the pull-up transistor.

Example System

Figure 8:
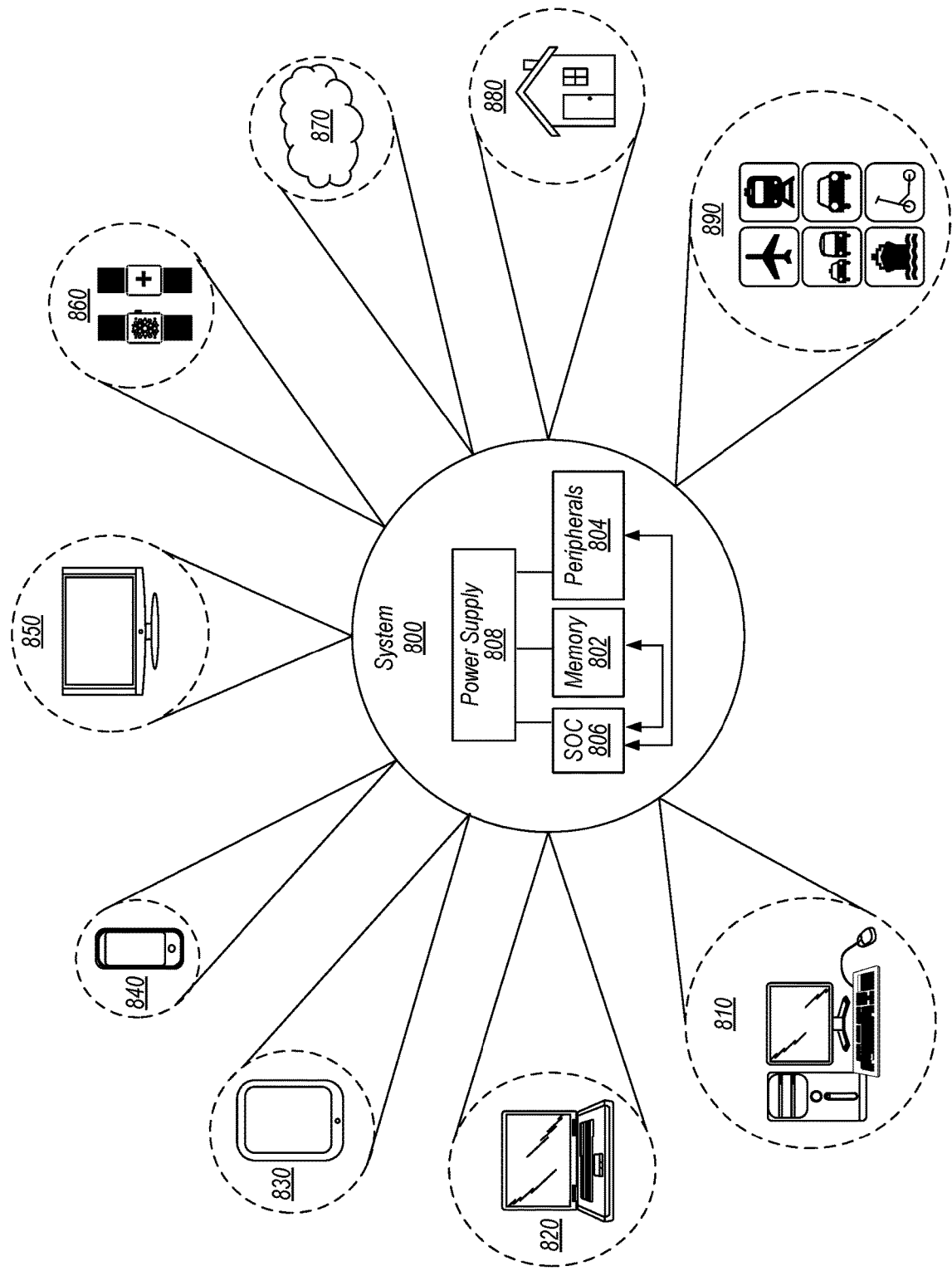
FIG. 8 is a block diagram illustrating one embodiment of an example system.

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

In various embodiments of system 800, one or more instances of a delay circuit, as discussed above, is implemented. For example, SOC 806 may be an integrated circuit that includes one or more instances of a delay circuit in one of the various embodiments falling within the scope of this disclosure.

Computer Readable Medium and Fabrication System:

FIG. 9 is a block diagram of one embodiment of a manufacturing system 900. The system includes a non-transitory computer readable medium 920 having stored thereon a instructions/description 950 of a delay circuit of any one of the embodiments falling within the scope of this disclosure. The computer readable medium 920 may be one of a number of different types of non-transitory media, including disk storage, solid state drive (e.g., using flash memory), optical storage (e.g., CD-ROM), various types of random access memory (RAM), and so on, that are capable of providing persistent storage of information.

A computer system 940 is configured to read the circuit instructions/description 950 from computer readable medium 920. Furthermore, computer system 940 may execute the various instructions and used the circuit description to cause fabrication system 945 to manufacture one or more instances of the circuit represented by circuit instructions/description 950. Fabrication system 945 may be any type of automated system that can manufacture electronic circuits, such as an integrated circuit.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity, described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a delay circuit configured to receive an input signal, wherein the delay circuit includes:
      a first circuit configured to generate a first amount of delay such that the first amount of delay has a direct relationship to a first environmental parameter of the apparatus; and
      a second circuit configured to generate a second amount of delay such that the second amount of delay has an inverse relationship to a second environmental parameter of the apparatus, wherein one of the first and second environmental parameters is a supply voltage, and wherein another one of the first and second environmental parameters is a temperature;
   wherein the delay circuit is configured to generate a delayed output signal based on the first and second amounts of delay generated by the first and second circuits.

2. The apparatus of claim 1, wherein the first and second circuits are separately adjustable to achieve a particular amount of delay for the delay circuit.

3. The apparatus of claim 1, wherein the first circuit is a resistive-capacitive (RC) circuit and wherein the second circuit is configured to switch from a first state to a second state responsive to the RC circuit discharging down to a corresponding threshold voltage.

4. The apparatus of claim 3, wherein the second circuit is configured to increase an amount of delay by reducing the corresponding threshold voltage in response to an increase in temperature.

5. The apparatus of claim 3, wherein the RC circuit is configured to increase an amount of delay in response to a decrease in temperature and increase the amount of delay in response to a decrease in temperature.

6. The apparatus of claim 3, wherein the RC circuit includes:
   a pull-up transistor having a respective gate terminal coupled to an input node and a drain terminal coupled to an output node;
   a pull-down transistor having a respective gate terminal coupled to the input node and a source terminal coupled to a reference node;
   a resistor coupled between the output node and the pull-down transistor; and
   at least one capacitor coupled to the output node.

7. The apparatus of claim 6, wherein the RC circuit further includes a diode coupled between the resistor and the pull-down transistor.

8. The apparatus of claim 3, wherein the second circuit includes:
   a pull-down transistor having a respective gate terminal coupled to the RC circuit and a drain terminal coupled to an output node;
   a pull-up transistor having a respective gate terminal coupled to the RC circuit; and
   a resistor coupled between the output node and a drain terminal of the pull-up transistor.

9. A system comprising:
   a delay circuit having one or more stages, wherein the delay circuit is configured to apply a delay to an input signal to generate an output signal that is a delayed version of the input signal, wherein ones of the one or more stages of the delay circuit include:
      a first circuit configured to increase an amount of delay applied to the input signal between an input to the delay circuit and an output of the delay circuit in response to an increase in a supply voltage; and
      a second circuit configured to increase an amount of delay between the input and the output in response to an increase in a temperature of the delay circuit;
   wherein, in at least one of the one or more stages, the first circuit is configured to decrease the amount of delay between the input and the output in response to an increase in a temperature of the delay circuit.

10. The system of claim 9, further comprising a time-to-digital converter (TDC) circuit configured to generate a digital value based on an amount of elapsed time of propagation of a signal, wherein the TDC circuit is configured to generate the digital value in response to receiving the output signal from the delay circuit.

11. The system of claim 9, wherein the first circuit of at least one of the stages is a resistive-capacitive (RC) circuit configured to increase the amount of delay in response to the supply voltage increasing.

12. The system of claim 11, wherein the RC circuit includes:
   a pull-up transistor having a respective gate terminal coupled to an RC circuit input node and a drain terminal coupled to an RC circuit output node;
   a pull-down transistor having a respective gate terminal coupled to the RC circuit input node and a source terminal coupled to a reference node;
   a resistor coupled between the RC circuit output node and the pull-down transistor; and
   at least one capacitor coupled to the RC circuit output node.

13. The system of claim 12, wherein the RC circuit further includes a diode-coupled transistor coupled between the resistor and transistor, and wherein the diode-coupled transistor is configured to cause the RC circuit to decrease the amount of delay in response to the temperature increasing.

14. The system of claim 11, wherein the second circuit of at least one of the stages is a trip point circuit including:
- a pull-down transistor having a gate terminal coupled to an output of the RC circuit and a drain terminal coupled to a trip point circuit output;
- a resistor having a first terminal coupled to the trip point circuit output; and
- a pull-up transistor having a gate terminal coupled to the output of the RC circuit, wherein the pull-up transistor is coupled between a second terminal of the resistor and a supply voltage node;
- wherein the trip point circuit is configured to increase the amount of delay in response to an increase in a temperature of the delay circuit.

15. The system of claim 9, wherein the first and second circuits are separately adjustable to achieve a particular amount of delay for the delay circuit.

16. The system of claim 9, wherein the delay circuit includes a first stage and a second stage, wherein a first circuit of the first stage has a different circuit topology with respect to a first circuit of the second stage.

17. A non-transitory computer readable medium storing instructions that, when executed on a computer system, are usable to manufacture an electronic circuit, the electronic circuit comprising:
- a delay circuit configured to receive an input signal and generate an output signal that is a delayed version of the input signal, wherein the delay circuit includes a plurality of stages, wherein ones of the plurality of stages include:
  - a first circuit element configured to vary a first delay applied to the input signal in a direct relationship to a first environmental parameter of the delay circuit; and
  - a second circuit element configured to vary a second delay applied to the input signal in an inverse relationship to a second environmental parameter;
  - wherein the delay circuit is configured to generate the output signal based on the first and second delays; and
  - wherein at least one of the plurality of stages implements circuitry in which a total amount of delay has a direct relationship with temperature, an inverse relationship with temperature, and a direct relationship with voltage.

18. The computer readable medium of claim 17, wherein the first environmental parameter is a supply voltage, and wherein the second environmental parameter is a temperature.

19. The computer readable medium of claim 17, wherein the first and second environmental parameters are both temperatures.

20. The computer readable medium of claim 17, wherein the electronic circuit further comprises a time-to-digital converter (TDC) circuit configured to generate a digital value based on an amount of elapsed time of propagation of a signal, wherein the TDC circuit is configured to generate the digital value in response to receiving the output signal from the delay circuit.

* * * * *